(12) United States Patent
Krastev

(10) Patent No.: US 8,256,722 B2
(45) Date of Patent: Sep. 4, 2012

(54) GUIDING DEVICE AND GUIDING ASSEMBLY FOR GUIDING CABLES AND/OR HOSES, AND A LITHOGRAPHIC APPARATUS

(75) Inventor: Krassimir Todorov Krastev, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 514 days.

(21) Appl. No.: 12/579,040

(22) Filed: Oct. 14, 2009

(65) Prior Publication Data

US 2010/0096512 A1    Apr. 22, 2010

Related U.S. Application Data

(60) Provisional application No. 61/107,184, filed on Oct. 21, 2008.

(51) Int. Cl.
  *F16L 3/22*  (2006.01)
  *F16G 13/00*  (2006.01)
  *G03B 27/42*  (2006.01)

(52) U.S. Cl. ............... 248/68.1; 59/78.1; 355/53

(58) Field of Classification Search ........... 59/78.1; 355/53, 72; 248/65, 67.5, 67.7, 68.1, 73; 174/48

See application file for complete search history.

(56) References Cited

U.S. PATENT DOCUMENTS

| | | | |
|---|---|---|---|
| 2,975,807 A * | 3/1961 | Waninger | 138/108 |
| 3,197,954 A * | 8/1965 | Merker et al. | 59/78.1 |
| 3,551,612 A * | 12/1970 | Guentner | 191/12 C |
| 5,230,420 A * | 7/1993 | Meier et al. | 198/750.1 |
| 6,858,797 B2 * | 2/2005 | Sheikholeslami et al. | 174/480 |
| 6,941,974 B2 * | 9/2005 | Utaki | 138/120 |
| 7,418,812 B2 * | 9/2008 | Ikeda et al. | 59/78.1 |
| 2005/0274850 A1 * | 12/2005 | Blase et al. | 248/65 |
| 2011/0240805 A1 * | 10/2011 | Komiya | 248/68.1 |

FOREIGN PATENT DOCUMENTS

DE    198 40 012 A1    4/2000
WO    WO 2006/108401 A1    10/2006

* cited by examiner

*Primary Examiner* — Hung Henry Nguyen
*Assistant Examiner* — Steven H Whitesell Gordon
(74) *Attorney, Agent, or Firm* — Pillsbury Winthrop Shaw Pittman LLP

(57) ABSTRACT

A guide for guiding cables and/or hoses between two parts that are moveable relative to each other, the guide including a band having a length, width and thickness, and having a torsional stiffness about a longitudinal axis of the band, a bending stiffness about an axis in the width direction, and a shear stiffness in the thickness direction, multiple blocks fitted to the band, and a deformable member provided between two adjacent blocks, the deformable member being connected to the adjacent blocks and having a torsional stiffness about the longitudinal axis of the band, a shear stiffness in the thickness direction, and a bending stiffness about the axis in the width direction, wherein the torsional stiffness of the deformable member is substantially greater than the torsional stiffness of the band, and wherein the shear stiffness of the deformable member is substantially greater than the shear stiffness of the band.

16 Claims, 6 Drawing Sheets

GUIDING DEVICE AND GUIDING ASSEMBLY FOR GUIDING CABLES AND/OR HOSES, AND A LITHOGRAPHIC APPARATUS

CROSS REFERENCE TO RELATED APPLICATIONS

This application claims priority and benefit under 35 U.S.C. §119(e) to U.S. Provisional Patent Application No. 61/107,184, entitled "Guiding Device and Guiding Assembly for Guiding Cables and/or Hoses, and a Lithographic Apparatus", filed on Oct. 21, 2008. The content of that application is incorporated herein in its entirety by reference.

FIELD

The present invention relates to a guiding device and guiding assembly for guiding cables and/or hoses between two parts that move relative to each other, and a lithographic apparatus including such a guiding assembly.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The patterning device and substrate are generally supported by a movable support structure, which is connected to a positioner to accurately position the patterning device and substrate respectively in accordance with certain parameters and with respect to a frame. This frame can be any kind of frame, for instance a metrology frame or a base frame. When the support structure and the frame are movable with respect to each other and cables and/or hoses are provided between the two parts, a guiding device is normally used to guide the cables and/or hoses from one part to the other, thereby preventing wear and damage of the cables and/or hoses and preventing that the cables and/or hoses are interfering with the relative movement of the parts or other portions of the lithographic apparatus.

The guiding device is generally a chain arranged between the two parts in a U-shaped loop, such that the chain adapts its U-shape to the relative position of the two parts. Such a chain is described in WO 2006/108401 A1, the content of which is incorporated herein by reference in its entirety. A benefit of a chain structure is that it provides a stiff structure that can be used in both a horizontal and vertical orientation, wherein the bending axis of the chain is about a horizontal or vertical axis respectively. FIG. 8 of WO 2006/108401 A1 shows that the links 2 in the U-turn move with respect to each other when the two parts move relatively to each other. This results in friction between the links, and between the links and the cables and/or hoses, causing wear and small damages to the links, so that small particles are released. Therefore, this type of guiding device may not be suitable for a clean environment such as a lithographic apparatus.

Another type of guiding device is described DE 198.40.012 A1, the content of which is incorporated herein by reference in its entirety. The document shows a guiding device with elastically deformable joints made of plastic to provide the desired bending. With this type of device, the stiffness in the vertical direction is relatively low and there is the possibility to twist the guiding device about an horizontal longitudinal axis of the guiding device. This may cause friction between different portions of the guiding device, but also limits the load capacity. The limited load capacity shows itself when the guiding device is used in a vertical orientation by sagging and significant deviations from the desired U-shape loop. These type of guiding devices is therefore mainly used in horizontally oriented cable guiding. Further, with this type of device, the use of plastic material makes the guiding device not suitable for vacuum environments due to outgassing of the plastic material.

SUMMARY

It is desirable to provide a guiding device for guiding cables and/or hoses between two parts that are moveable relative to each other, that can be used in a clean environment, such as a lithographic apparatus, in both a horizontal and vertical orientation.

According to an embodiment of the invention, there is provided a guide for guiding cables and/or hoses between two parts that are moveable relative to each other including a band having a length, width and thickness, and having a torsional stiffness about a longitudinal axis of the band, a bending stiffness about an axis in the width direction, and a shear stiffness in the thickness direction, multiple blocks fitted to the band, and at least one deformable member provided between at least two adjacent blocks, wherein the at least one deformable member is connected to the adjacent blocks, the at least one deformable member having a torsional stiffness about a longitudinal axis of the band, a shear stiffness in the thickness direction, and a bending stiffness about an axis in the width direction, wherein the torsional stiffness of the at least one deformable member is substantially greater than the torsional stiffness of the band, and wherein the shear stiffness of the at least one deformable member is substantially greater than the shear stiffness of the band.

According to another embodiment of the invention, there is provided a guide assembly for guiding cables and/or hoses between two parts that are moveable relative to each other including two guides, each guide including a band having a length, width and thickness, and having a torsional stiffness about a longitudinal axis of the band, a bending stiffness about an axis in the width direction, and a shear stiffness in the thickness direction, multiple blocks fitted to the band, and at least one deformable member provided between at least two adjacent blocks, wherein the at least one deformable member is connected to the adjacent blocks, the at least one deformable member having a torsional stiffness about a longitudinal axis of the band, a shear stiffness in the thickness direction, and a bending stiffness about an axis in the width direction, wherein the torsional stiffness of the at least one deformable member is substantially greater than the torsional stiffness of the band, and wherein the shear stiffness of the at least one deformable member is substantially greater than the shear stiffness of the band.

According to yet another embodiment of the invention, there is provided a lithographic apparatus including a frame, an illumination system configured to condition a radiation beam, a patterning device support constructed to support a patterning device, the patterning device being capable of imparting the radiation beam with a pattern in its cross-section to form a patterned radiation beam. The lithographic apparatus further including a substrate support constructed to hold a substrate, a projection system configured to project the patterned radiation beam onto a target portion of the substrate, and a guide assembly between the patterning device support and the frame and/or between the substrate support and the frame. The guide assembly including two guides, each guide including a band having a length, width and thickness, and having a torsional stiffness about a longitudinal axis of the band, a bending stiffness about an axis in the width direction, and a shear stiffness in the thickness direction, multiple blocks fitted to the band, and at least one deformable member provided between at least two adjacent blocks, wherein the at least one deformable member is connected to the adjacent blocks, the at least one deformable member having a torsional stiffness about a longitudinal axis of the band, a shear stiffness in the thickness direction, and a bending stiffness about an axis in the width direction, wherein the torsional stiffness of the at least one deformable member is substantially greater than the torsional stiffness of the band, and wherein the shear stiffness of the at least one deformable member is substantially greater than the shear stiffness of the band.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
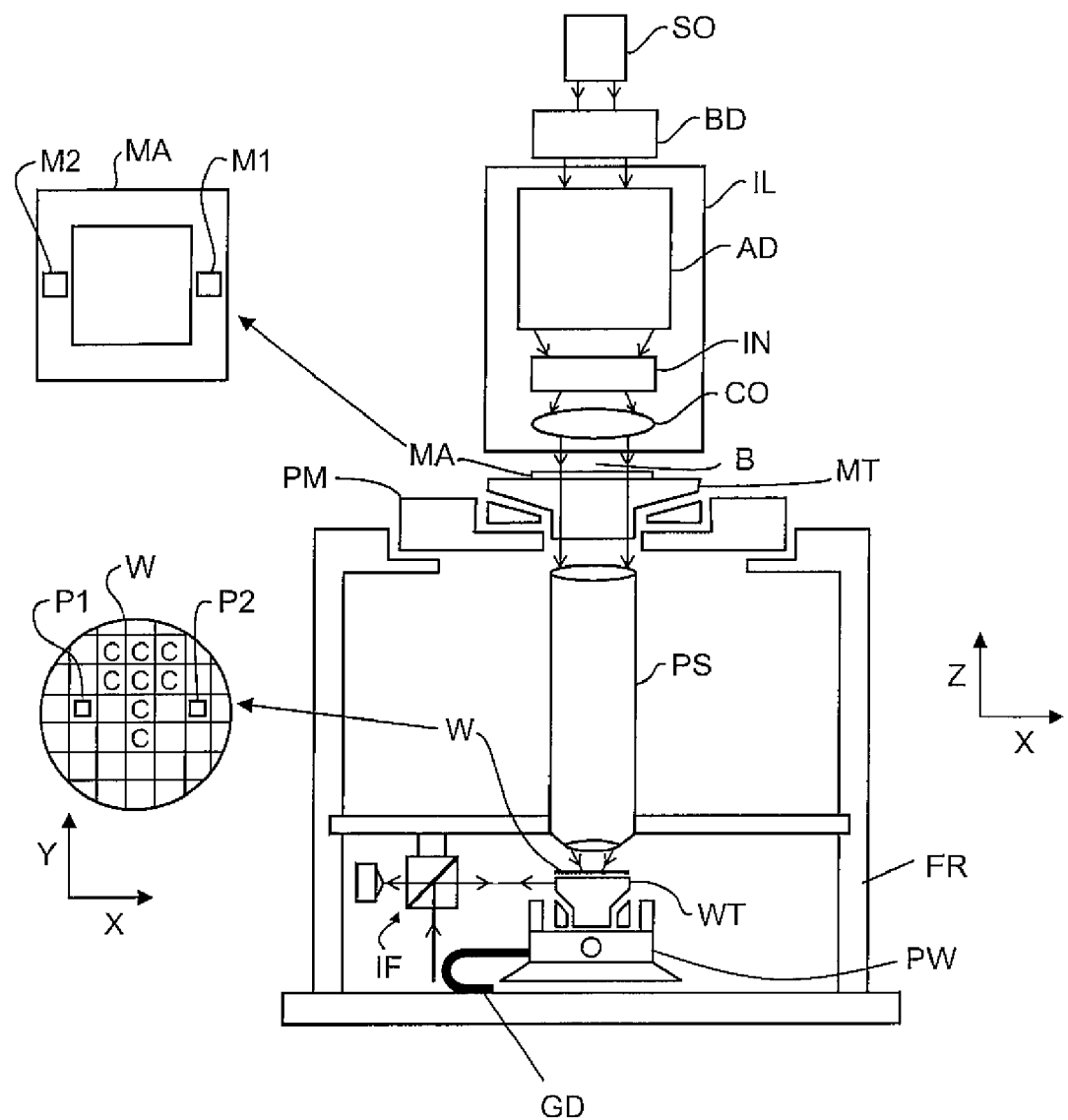
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the minor matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam. B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Every mode is characterized by the fact that some parts of the lithographic apparatus are stationary, while other parts are movable with respect to a frame. The frame can be a metrology frame or a base frame. In this embodiment, the frame is represented by frame FR.

At least the substrate table WT is movable to allow the supply and removal of substrates W and scanning movement in scanning type lithographic apparatus. Many variants exist in how to move and position the substrate table WT. In one variant the substrate table is movable with respect to the positioning device PW, which is substantially stationary with respect to the frame FR.

In another variant, the substrate table WT is not movable with respect to the positioning device PW, but the positioning device PW is movable with respect to the frame FR.

In yet another variant the substrate table WT is movable relatively to the positioning device WT and the frame FR, and the positioning device WT is movable with respect to the frame FR and the substrate table WT. This is for instance the case if the movement in x-direction is actuated between the frame FR and the positioning device PW, and the movement in y-direction is actuated between the positioning device PW and substrate table WT. Another possibility is that a long-stroke actuator is situated between the frame FR and the positioning device PW, and a short-stroke actuator is situated between the positioning device PW and the frame FR.

It is desirable that cables be provided between the moving parts that are movable relatively to each other, when devices that require power and/or communicate with other parts by electronic signals are situated on the moving part. Also supply or discharge hoses, transporting pressurized gas/air, immersion fluid or vacuum can be provided between the moving parts. It is desirable to guide these cables and/or hoses in order to avoid damage and wear of the cables and prevent the cables from interfering with the relative movement of the parts or other portions of the apparatus. This is normally done by a guiding device (also broadly termed "guide" hereinafter) GD as shown in FIG. 1. In this example the guide GD is situated between the frame FR and the positioning device PW. The guide GD is U-shaped and in this example oriented horizontally, wherein the bending axis is horizontal. However, the orientation can also be vertical, wherein the bending axis is vertical. The guide GD guides cables and/or hoses from the frame FR to the positioning device PW. This is preferably done in such a manner that the guide GD is not interfering with the movement of the positioning device PW. It is common practice that the interior of the lithographic apparatus is a clean environment. This results in specific demands. One of these demands is that the particle generation is reduced to a minimum. In case of vacuum, outgassing of materials should also be avoided. These demands thus also apply to the guides used in a lithographic apparatus.

Figure 2:
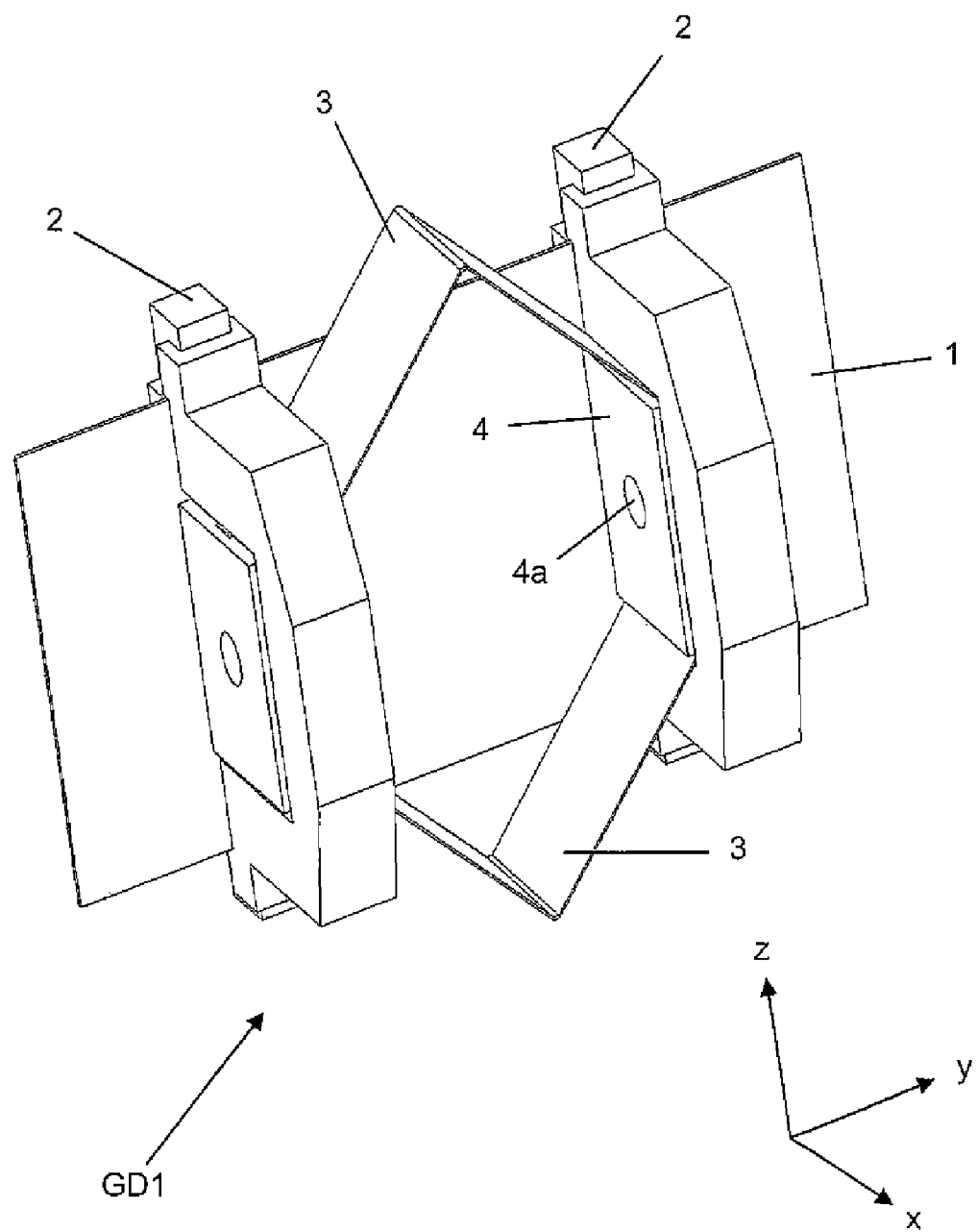
FIG. 2 depicts a portion of a guide according to an embodiment of the invention.

FIG. 2 shows a portion of a guide GD1 according to an embodiment of the invention. The guide GD1 includes a band 1 having a length, a width and a thickness. The band 1 also has a torsional stiffness about a longitudinal axis, a shear stiffness in the thickness direction, and a bending stiffness about an axis in the width direction. The skilled person will recognize that the band 1, which can be of considerable length, is easy to twist about a longitudinal axis in the y-direction, easy to bend about an axis in the z-direction, and easy to deform due to shear forces in the x-direction. The benefit of the band 1 is that it has a relatively high stiffness for loads in the z-direction.

The guide GD1 farther includes a plurality of blocks 2 of which two are shown in this Figure. The blocks 2 are firmly fitted to the band 1. Between at least two adjacent blocks 2, a deformable member 3 is provided. The deformable member 3 has a torsional stiffness about an axis in the y-direction, a bending stiffness about an axis in the z-direction and a shear stiffness in the x-direction. The torsional stiffness of the deformable member 3 is substantially greater than the torsional stiffness of the band 1. The shear stiffness of the deformable member 3 is substantially greater than the shear stiffness of the band 1. In this way, the deformable member 3 strengthens the guide GD1 in these directions, thereby preventing sagging and deformations in the z-direction when the guide GD1 is used in a vertical orientation, wherein the desired bending axis of the guide GD1 is vertical. Preferably, a continuous series of blocks 2 and deformable members is provided along the band 1 to strengthen the band 1 along the entire length of the band 1.

The bending stiffness of the deformable member 3 and the band 1 are such that the guide GD1 can easily bend about an axis in the z-direction, which is the desired bending for arranging the guide GD1 in a U-shaped loop.

The deformable member 3 in this example includes two V-shaped leaf springs, such that the V's project outwardly in the width direction of the band 1. The leaf springs 3 provide the required stiffness to strengthen the guide GD1 except for the bending about an axis in the z-direction.

The leaf springs 3 are connected to the block 2 by a connection device (also broadly termed "connector" hereinafter) including two connection parts 4 and 5, of which only 4 can be seen in FIG. 2. For connection part 5 is referred to FIG. 3. In this case, the leaf springs are clamped between the connection part 4 and block 2, but other connection principles such as bolting or screwing are also possible. It is also possible that no connector is required, but that the leaf springs are connected directly, for instance glued, to the blocks 2. In this embodiment, the connection part 4 is provided with a hole 4a, through which a bolt or screw can be inserted to connect the connection part 4 to the block 2.

A benefit of the guide GD1 is that there exists no friction between different portions of the guide GD1. The guide GD1 is only deformed resulting in minimal particle generation, thereby making this guide GD1 especially suitable for clean environments. Another benefit is that the guide GD1 can be used in both a horizontal and vertical orientation.

Not shown in this Figure is that the guide GD1 may include two end blocks that are fitted to the ends of the band 1, such that the guide GD1 can be connected to the two relatively to each other moving parts. It is then possible that the leaf springs 3 are also arranged between an end block and an adjacent block 2, thereby strengthening the guide GD1 over the entire length of the band 1.

Figure 3:
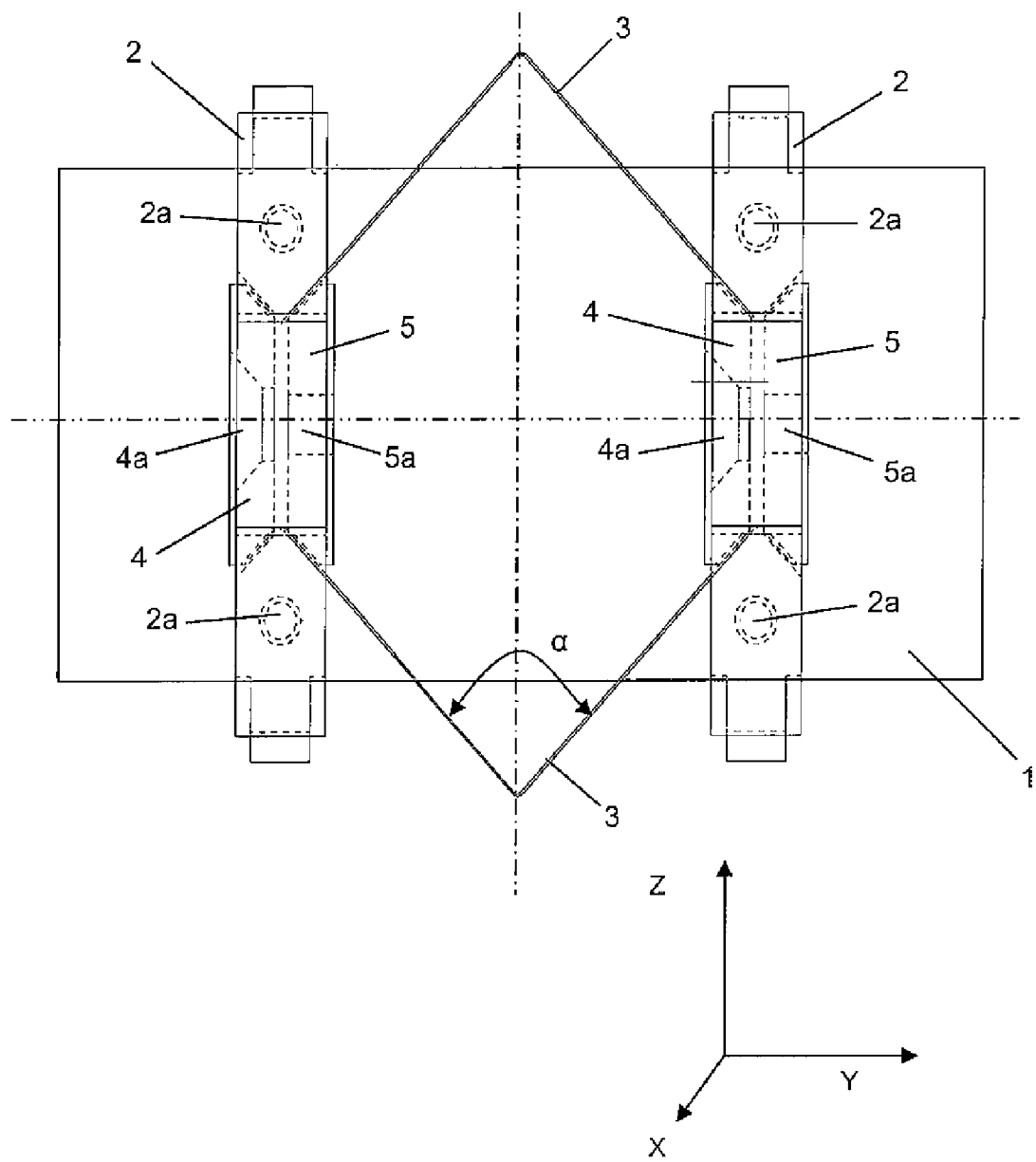
FIG. 3 depicts a front view of the guide of FIG. 2.

FIG. 3 depicts a front view of the guide GD1 from FIG. 2. Dotted lines in this figure indicate that these portions cannot be seen in this front view and are hidden behind other portions. FIG. 3 shows in more detail how the leaf springs 3 are connected to the blocks 2 by the connector. The connector includes two connection parts 4, 5 which are inserted in an opening in the block 2. The connection parts 4 and 5 are at least partially complementary to the inside of the opening in the block 2, such that a connection part 4, 5 is larger than the opening in the block 2. In this embodiment, connection part 4 and connection part 5 both are provided with a hole 4a, 5a respectively, wherein hole 5a is threaded. A bolt (not shown) bolted into hole 5a through hole 4a will connect the two connection parts 4, 5 together, thereby clamping the block 2 and connecting the connection parts 4, 5 to the block 2. The leaf springs are clamped between the complementary portions of the connection parts 4, 5 and the block 2.

The block 2 is provided with holes 2a, wherein a bolt or the like can be inserted to connect the block 2 to the band 1. Other connection methods are also envisaged.

In this embodiment, the leaf springs 3 are V-shaped, with an angle α between two legs of the V. Preferably, the angle α is approximately 90°. Further, the leaf springs 3 are preferably arranged such that they are symmetrical with respect to two dash-dotted lines, which run through respectively the centre line of the band 1 and the two points of the V-shape of the leaf springs 3.

Figure 4:
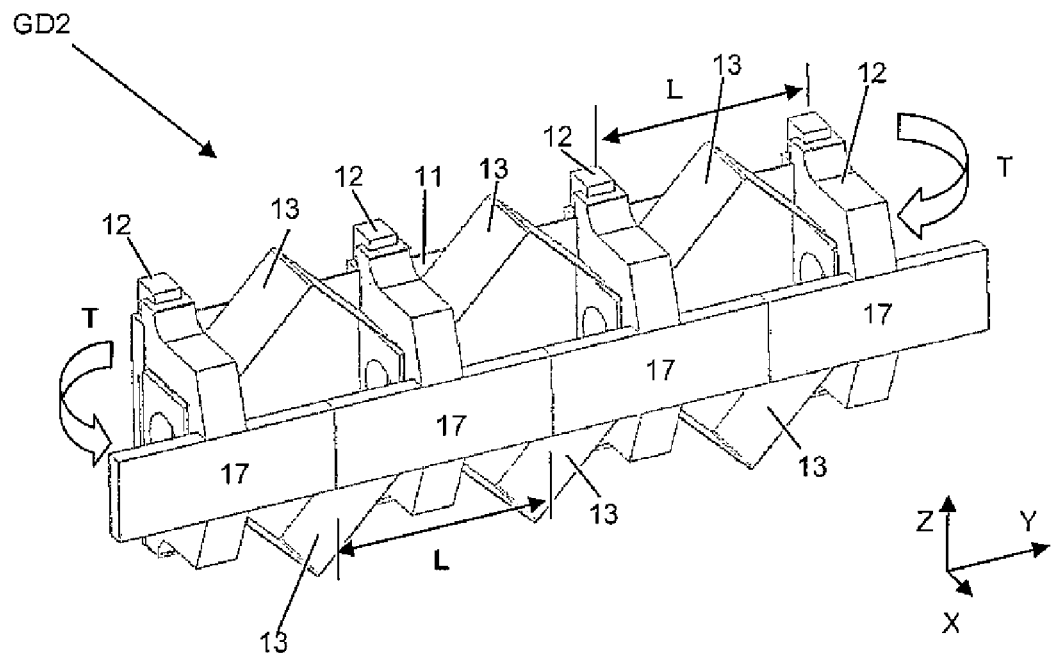
FIG. 4 depicts in perspective a portion of a guide according to yet another embodiment of the invention.

FIG. 4 depicts a guide GD2 according to yet another embodiment of the invention. Only a portion of the guide GD2 is shown in this figure. The guide GD2 includes a band 11 on which multiple blocks 12 are fitted. Between the multiple block 2 are provided leaf springs 13 in a similar way as the guide GD1 in FIGS. 2 and 3. In this embodiment, the blocks 12 each include an extension 17 extending in the longitudinal direction of the band 11. The length of the extension 17 is equal to the pitch of the blocks 12, represented by the dimension L, so that extensions 17 contact each other when the band 11 is straight, as shown in FIG. 4. The extensions 17 prevent the guide GD2 from bending in the direction T. The guide GD2 can only bend in the direction opposite to direction T, and thus the extensions 17 cause an unilateral bending of the guide, which is beneficial for getting a predictable U-shape.

In this embodiment, the extensions 17 contact each other at half the pitch L between the blocks 2. It is also possible that the extensions 17 are shifted so that for instance the extensions 17 only extend to one side of the block 2.

It is also possible that the length of the extensions 17 is smaller or bigger, to allow a slight increase or decrease in bending in direction T.

Figure 5:
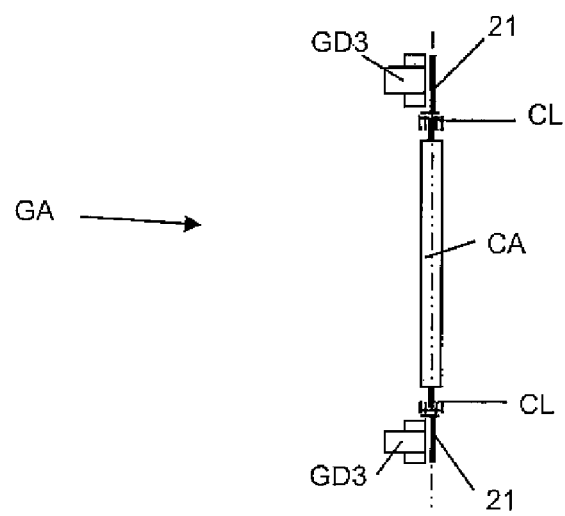
FIG. 5 depicts a cross sectional view of a guide assembly according to a further embodiment of the invention.

FIG. 5 depicts a cross sectional view of a guide assembly GA according to yet another embodiment of the invention. The guide assembly includes two guides GD3 and a cable assembly CA. The guides GD3 are provided to guide the cable assembly CA.

The guide GD3 includes a band 21 similar to the guides GD1 and GD2. The cable assembly CA includes multiple cables and/or hoses which are joined together. In this embodiment, the cable assembly CA is placed in between the guides GD3, such that the guide assembly can bend about a vertical axis. Preferably, as shown in this embodiment, the band 21 of the guide GD3 is aligned with the cable assembly CA.

In this example, the guide assembly GA further includes clamps CL which connect the cable assembly CA to the guides GD3. By placing the cable assembly CA in between the two guides GD3, and clamping them together, there is no friction between the cables assembly CA and the guides GD3, thereby making this guide assembly suitable for use in a clean environment such as a lithographic apparatus. The stiffness of the guides GD3 in the vertical direction allows the guiding assembly GA to be used in a vertical orientation as well as in a horizontal orientation.

Figure 6:
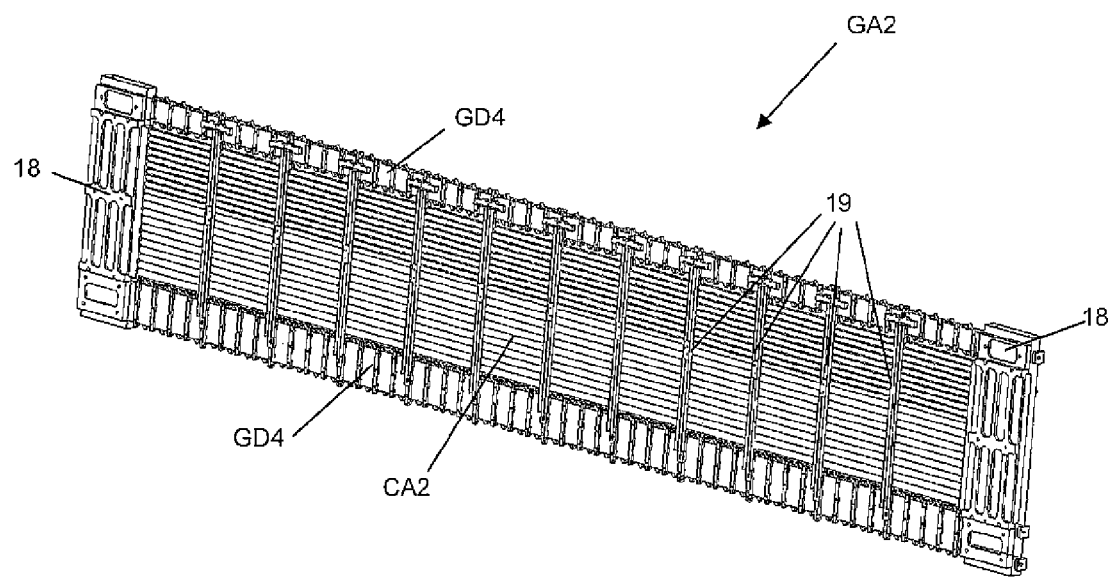
FIG. 6 depicts in perspective a guide assembly according to yet another embodiment of the invention.

FIG. 6 depicts a guide assembly GA2 according to another embodiment of the invention. The guide assembly GA2 includes two guides GD4 and a cable assembly CA2. The guides GD4 include two ends blocks 18 fitted to the end of the bands of the guide GD4. In this example, only two end blocks 18 are provided for the two guides GD4, but also an embodiment is possible wherein each guide GD4 has two separate end blocks. The cable assembly CA2 is arranged between the guides GD4. The end blocks 18 are each connectable to a moveable part.

To further strengthen the guide assembly, connection bars 19 can be provided to connect the two guides GD4. Only four connection bars 19 are designated by a reference numeral, but in total eleven connection bars 19 are shown in this Figure. It is envisaged that the connection bars 19 are also connected to the cable assembly CA2 to support the cable assembly CA2.

Figure 7:
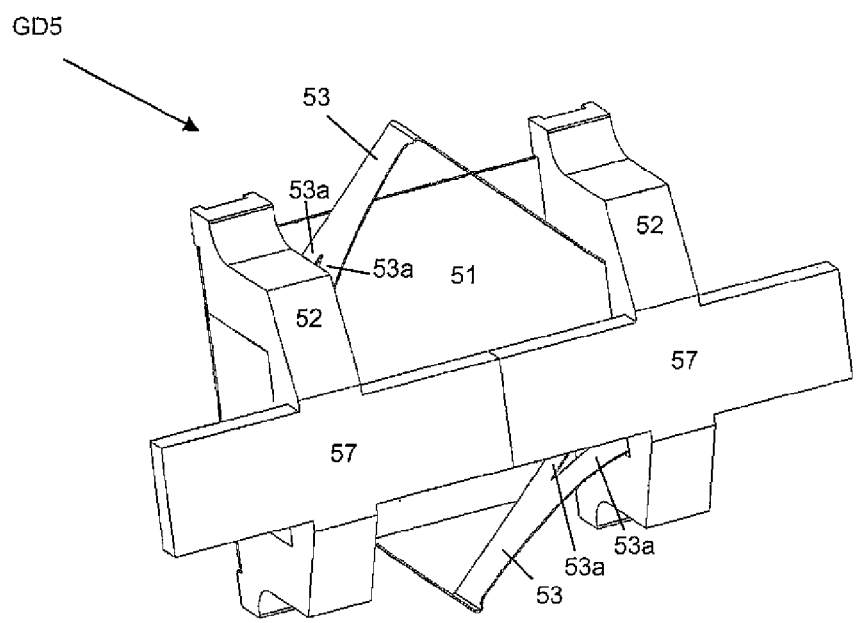
FIG. 7 depicts a portion of a guide according to a further embodiment of the invention in perspective.

FIG. 7 shows a portion of a guide GD5 according to yet another embodiment of the invention. The guide includes a band 51, multiple blocks 52 fitted to the band 51, and V-shaped leaf springs 53 between the multiple blocks 52, similar to the guides GD1 and GD2.

The blocks 52 have extensions 57 to allow an unilateral bending of the guide similar to guide GD2. The width of the leaf springs 53 tapers towards the V-point and include two legs 53a at the portion that is connected to the blocks 52. This design of the leaf springs 53 optimizes the stiffness in different directions and reduces the stresses in the material.

Figure 8:
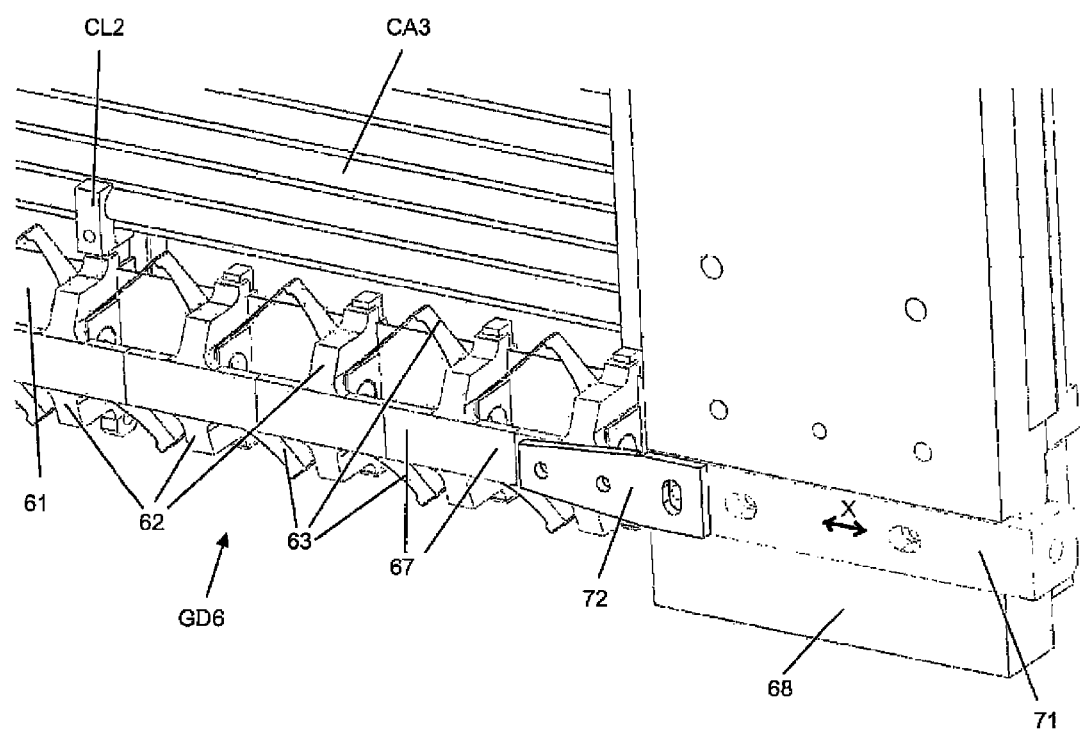
FIG. 8 depicts a detail of the connection of a guide to an end block according to yet another embodiment of the invention.

FIG. 8 depicts a detail of the connection of a guide GD6 to an end block 68. In this embodiment, the guide GD6 includes a band 61, multiple blocks 62 and deformable members 63 between multiple blocks 62 similar to the embodiment of FIG. 2. The multiple blocks 62 include extensions 67 similar to the embodiment of FIG. 4. The guide GD6 guides a cable assembly CA3, which is connected to the guide GD6 by a clamp CL2. The clamp CL2 is attached to one of the multiple blocks 62.

The guide GD6 is connected to the end block 68 by clamping of the band 61 (not shown) and a plate 72. The plate 72 is in this embodiment at one end connected to adjacent extensions 67. This is beneficial because the connection can be reached from both sides of the extensions 67. The end block 68 includes a moveable bar 71 to which the other end of plate 72 is connected. The movement of the moveable bar 71, indicated by arrow X, allows to align the guide GD6 with another guide GD6 (not shown) which can be present similar to the embodiment of FIG. 6. It further allows compensation for a difference in length between the guides GD6. After the alignment of the guide GD6, the moveable bar 71 is fixed firmly to the other portions of end block 68, such that in use, no frictional movement can occur. The movement of the moveable bar 71 can also cause bending of the guide GD6. If the band 61 is connected to the end block 68 and the guide GD6 is connected to the moveable bar 71, movement of the bar 71 in the X-direction will cause the guide GD6 to bend.

Other ways of connecting the guide GD6 to the end block 68 are also envisaged.

A guide according to an embodiment of the invention, in particular the embodiments shown in the FIGS. 2-8, can be made at least partially from a metallic material. A metallic material has the benefit that it is a non-outgassing material, which is preferred in a vacuum environment. In a variant, the deformable member and the band could be made of a metallic material, whereas the blocks could be made as a composite structure with contacting surfaces made of metal with special coatings, e.g. TiN, TiAlN, or MoST, attached to non-outgassing plastic carrier-bodies, e.g. Teflon, vespel. Such a guide allows reduction of the weight of the guides, which is important for high speed applications.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A guide for guiding a cable and/or hose between two parts that are moveable relative to each other, the guide comprising:
    a band having a length, width and thickness, and having a torsional stiffness about a longitudinal axis of the band, a bending stiffness about an axis in the width direction, and a shear stiffness in the thickness direction;
    a plurality of blocks fitted to the band; and
    a deformable member provided between two adjacent blocks, the deformable member being connected to the two adjacent blocks, the deformable member having a torsional stiffness about the longitudinal axis of the band, a shear stiffness in the thickness direction, and a bending stiffness about the axis in the width direction, wherein the torsional stiffness of the deformable member is substantially greater than the torsional stiffness of the band, and wherein the shear stiffness of the deformable member is substantially greater than the shear stiffness of the band.

2. The guide according to claim 1, further comprising connectors configured to connect the deformable member to the adjacent blocks.

3. The guide according to claim 1, further comprising two end blocks fitted to the ends of the band and connectable to the two parts.

4. The guide according to claim 1, wherein the plurality of blocks comprise extensions extending in the longitudinal direction of the band and that are in contact with each other when the band is straight, such that the guide can bend unilaterally about an axis in the width direction.

5. The guide according to claim 1, wherein the guide is at least partially made of a metallic material.

6. The guide according to claim 5, wherein the band and the deformable member are made of a metallic material, and the plurality of blocks are made at least partially of a non-outgassing plastic material.

7. The guide according to claim 1, comprising a continuous series of blocks and deformable members provided along the band.

8. The guide according to claim 1, wherein the deformable member comprises a leaf spring.

9. The guide according to claim 1, wherein the deformable member comprises two leaf springs that are each folded in a V-shape, such that both V-shapes project outwardly in the width direction.

10. A guide assembly for guiding cables and/or hoses between two parts that are moveable relative to each other, the guide assembly comprising:
    two guides that each comprise
        a band having a length, width and thickness, and having a torsional stiffness about a longitudinal axis of the band, a bending stiffness about an axis in the width direction, and a shear stiffness in the thickness direction;
        a plurality of blocks fitted to the band; and
        a deformable member provided between two adjacent blocks, the deformable member being connected to the two adjacent blocks, the deformable member having a torsional stiffness about the longitudinal axis of the band, a shear stiffness in the thickness direction, and a bending stiffness about the axis in the width direction, wherein the torsional stiffness of the deformable member is substantially greater than the torsional stiffness of the band, and wherein the shear stiffness of the deformable member is substantially greater than the shear stiffness of the band; and
    a plurality of cables and/or hoses which are joined together in an elongated cable assembly,
    wherein the cable assembly is connected to the two guides in the width direction.

11. The guide assembly according to claim 10, further comprising a plurality of clamps configured to connect the cable assembly to the two guides.

12. The guide assembly according to claim 10, wherein the cable assembly is mainly aligned with the bands of the guides.

13. The guide assembly according to claim 10, wherein a connection bar is provided to connect the two guides.

14. The guide assembly according to claim 13, wherein the connection bar is arranged to support the cable assembly between the two guides.

15. The guide assembly according to claim 10, further comprising two end blocks that are each fitted to the end of both bands of the guides, wherein the end blocks are connectable to the moving parts.

16. A lithographic apparatus comprising:
    a frame;
    an illumination system configured to condition a radiation beam;
    a patterning device support constructed to support a patterning device, the patterning device being capable of imparting the radiation beam with a pattern in its cross-section to form a patterned radiation beam;
    a substrate support constructed to hold a substrate;
    a projection system configured to project the patterned radiation beam onto a target portion of the substrate; and
    a guide assembly between the patterning device support and the frame and/or between the substrate support and the frame, the guide assembly being configured to guide a cable and/or hose between two parts that are moveable relative to each other, the guide assembly comprising
        two guides that each comprise
            a band having a length, width and thickness, and having a torsional stiffness about a longitudinal axis of the band, a bending stiffness about an axis in the width direction, and a shear stiffness in the thickness direction;

a plurality of blocks fitted to the band; and a deformable member provided between two adjacent blocks, the deformable member being connected to the two adjacent blocks, the deformable member having a torsional stiffness about the longitudinal axis of the band, a shear stiffness in the thickness direction, and a bending stiffness about the axis in the width direction, wherein the torsional stiffness of the deformable member is substantially greater than the torsional stiffness of the band, and wherein the shear stiffness of the deformable member is substantially greater than the shear stiffness of the band; and a plurality of cables and/or hoses which are joined together in an elongated cable assembly, wherein the cable assembly is connected to the two guides in the width direction.

* * * * *